(12) United States Patent
Harima

(10) Patent No.: US 7,821,347 B2
(45) Date of Patent: Oct. 26, 2010

(54) SURFACE-MOUNT CRYSTAL OSCILLATOR

(75) Inventor: Hidenori Harima, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 81 days.

(21) Appl. No.: 12/175,320

(22) Filed: Jul. 17, 2008

(65) Prior Publication Data

US 2009/0021315 A1    Jan. 22, 2009

(30) Foreign Application Priority Data

Jul. 19, 2007  (JP)  ............................... 2007-188682

(51) Int. Cl.
  *H03B 5/32*  (2006.01)
(52) U.S. Cl. ........................... 331/158; 331/60; 331/68; 331/108 C; 331/116 M; 331/154
(58) Field of Classification Search .................. 331/60, 331/68, 108 C, 116 M, 154, 158
  See application file for complete search history.

(56) References Cited

FOREIGN PATENT DOCUMENTS

JP        2000-49560 A        2/2000

*Primary Examiner*—Arnold Kinkead
*Assistant Examiner*—Richard Tan
(74) *Attorney, Agent, or Firm*—Knobbe Martens Olson & Bear LLP

(57) ABSTRACT

In a surface-mount crystal oscillator, an IC chip having an IC terminal at each of at least four corner portions is housed in a substantially rectangular recess. Circuit terminals to which the IC terminals are fixed via bumps are provided on an inner bottom surface of the recess, and external terminals electrically connected to the circuit terminals are provided at the four corner portions of an opening end surface surrounding the recess. In each of at least three vertices or corners on the inner bottom surface of the recess, an external terminal corresponding to the vertex is formed into an L-shape to be in contact with a longer side and a shorter side of an outer perimeter of the recess, and an exposed part in which the inner bottom surface is exposed is formed between the circuit terminal which is the closest to the vertex and its external terminal.

10 Claims, 3 Drawing Sheets

SURFACE-MOUNT CRYSTAL OSCILLATOR

BACKGROUND OF THE INVENTION

1. Field of the Invention

The present invention relates to a surface-mount crystal oscillator, and particularly relates to a surface-mount crystal oscillator capable of disposing an IC (integrated circuit) chip by positioning the IC chip with high accuracy on an inner bottom surface of a recess provided to house the IC chip.

2. Description of the Related Arts

Surface-mount crystal oscillators each configured by integrating a quartz crystal blank and an IC chip including an oscillating circuit which uses the crystal blank are widely used as reference sources for frequency and time in portable electronic devices represented by portable telephones, for example, because of its compact size and light weight. As such a surface-mount crystal oscillator, there is a two-chamber type crystal oscillator using a container body with recesses formed on both principal surfaces, in which an IC chip is housed in one of the recesses and a crystal blank is hermetically sealed in the other recess, as disclosed in, for example, Japanese Patent Laid-Open Application No. 2000-49560 (JP-A-2000-049560). The two-chamber type crystal oscillator, which has an H-shaped sectional shape, is also called an H-shaped structure type crystal oscillator. Alternatively, there is a bonding-type surface-mount crystal oscillator in which a mounting substrate housing an IC chip is joined to the bottom surface of a quartz crystal unit having the configuration in which a crystal blank is hermetically encapsulated in a container.

FIG. 1A is a sectional view showing an example of the configuration of the conventional two-chamber type surface-mount crystal oscillator. FIG. 1B is a bottom view of a container body in the crystal oscillator, and shows recess 20a provided in container body 1 to house IC chip 2.

The surface-mount crystal oscillator which is illustrated in the drawings includes container body 1 which is formed into a flat rectangular parallelepiped shape with recesses formed on both principal surfaces thereof respectively. Container body 1 is made of laminated ceramics having planer bottom plate 1a in a substantially rectangular shape, and frame wall layers 1b, 1c which are respectively laminated on both the principal surfaces of bottom plate 1a. A substantially rectangular opening is formed in each of frame wall layers 1b, 1c. Recess 20a which accommodates IC chip 2 is formed by the opening of frame wall layer 1b, and recess 20b which accommodates crystal blank 3 is formed by the opening of frame wall layer 1c. The illustrated undersurface of bottom plate 1a is exposed on the bottom surface of recess 20a, and the illustrated top surface of bottom plate 1a is exposed on the bottom surface of recess 20b.

As shown in FIG. 1B, the inner bottom surface of recess 20a which houses IC chip 2 is in a substantially rectangular shape, six circuit terminals 4a to 4f in total are provided so that three circuit terminals are along each of a pair of longer sides of the rectangle. The circuit terminals are used for electrical connection with IC chip 2 as will be described later. Specifically, circuit terminals 4a to 4f are provided at four corner portions of the inner bottom surfaces of recess 20a, and in a central region of each of the longer sides. Of them, the circuit terminals provided at the four corner portions of recess 20a are, for example, a power supply terminal, an output terminal, a ground terminal and an AFC (automatic frequency control) terminal. Remaining two circuit terminals 4c, 4d are, for example, crystal connection terminals for use in electrical connection of IC chip 2 and crystal blank 3. These circuit terminals are generally indicated by numeral 4 in FIG. 1A.

At four corner portions of an opening end surface of recess 20a of container body 1, specifically, four corner portions of the surface which is the illustrated undersurface of frame wall layer 1b and surrounds recess 20a, external terminals 6a to 6d are provided as terminals for use when the crystal oscillator is mounted on a wiring board so as to be in contact with outer edges of recess 20a at the shorter sides thereof. External terminals 6b to 6d are in the same shapes, but external terminal 6a is formed into a different shape from other external terminals 6b to 6d so as to facilitate positioning when the crystal oscillator is mounted on the wiring board, and discriminate the terminals. In the example shown here, external terminal 6a includes extension 6e extending in a longitudinal direction of container body 1. These external terminals are generally indicated by numeral 6 in FIG. 1B.

External terminals 6a to 6d respectively correspond to circuit terminals 4a to 4d at the four corner portions of the inner bottom surface of recess 20a, and are electrically connected to circuit terminals 4a to 4d by wiring paths 5 respectively. Wiring paths 5 extend from the circuit terminals to the four corner portions of recess 20a, from which, they extend to the positions of vertices of substantially rectangular bottom plate 1a from the circuit terminals via a lamination plane between bottom plate 1a and frame wall layer 1b, and further extend to the external terminals through the side surfaces of frame wall layer 1b on which through-hole processing is applied. The positions where through-hole processing is applied are the positions of the four corner portions in the outer periphery of frame wall layer 1b.

Circuit terminals 4a to 4f, wiring paths 5 and external terminals 6a to 6d are all provided as electrode layers provided on the surface of the ceramic sheet configuring the laminated ceramics. They are integrally provided with container body 1 when container body 1 is formed by laminating unfired ceramic raw sheets, that is, ceramic green sheets, and firing them. Specifically, underlying electrodes are formed beforehand on the green sheets corresponding to bottom plate 1a and frame wall layer 1b, the green sheets are laminated and fired, and thereafter, gold plating is applied onto the underlying electrodes, whereby the circuit terminals and external terminals are formed. At this time, the exposed parts of wiring paths 5 are also plated with gold. In particular, external terminals 6a to 6d are formed by forming the underlying electrodes to be larger than the external terminals on the planar green sheet, thereafter, providing the opening to be recess 20a in the green sheet by hollowing out the green sheet, and thereafter, performing lamination, firing and plating. Actually, green sheets of each layer of the size corresponding to a plurality of container bodies 1 are laminated and integrally fired, and thereafter, the fired lamination is divided into individual container bodies 1, whereby a plurality of container bodies 1 are manufactured at one time.

In circuit terminals 4a to 4d which are provided at the four corner portions of recess 20a, in order to discriminate the circuit terminals and position IC chip 2 when IC chip 2 is mounted, three circuit terminals 4a to 4c of them are formed into the same shapes, and remaining one circuit terminal 4d as well as wiring path 5 extending from it is formed into a different shape.

In a central region of each of the longer sides of recess 20a of container body 1, arc-shaped notch 7 for resin injection is provided on the inner wall of recess 20a, that is, the inner peripheral surface of the opening of frame wall layer 1b. The dimension of notch 7 is such a dimension as to allow the tip end of a nozzle for resin injection to be inserted between the outer periphery of IC chip 2 and the inner side surface of recess 20a, in the position of notch 7.

IC chip 2 is in a substantially rectangular shape, and is formed by integrating the electronic circuits including the oscillating circuit which uses crystal blank 3 on a semiconductor substrate. The oscillating circuit is formed on one principal surface of the semiconductor substrate by an ordinary semiconductor device fabrication process. Thus, of both the principal surfaces of IC chip 2, the surface on which the oscillating circuit is formed in the semiconductor substrate will be called a circuit formation plane. As shown in FIG. 1C, at four corner portions and central regions of the longer sides of the circuit formation plane, a plurality of IC terminals 13 for connecting IC chip 2 to an external circuit are provided to correspond to circuit terminals 4a to 4f on the inner bottom surface of recess 20a of container body 1. IC terminals 13 include, for example, a power supply terminal, a ground terminal, an oscillation output terminal, an AFC terminal, and a pair of connection terminals electrically connected to crystal blank 3.

IC chip 2 is fixed and electrically connected to the inner bottom surface of recess 20a by the method of flip chip bonding. More specifically, each of IC terminals 13 is secured to the corresponding circuit terminal by ultrasonic thermocompression bonding using bump 8 joined onto each of IC terminals 13, and thereby, IC chip 2 is fixed to container body 1. In this case, in order to position IC chip 2 with respect to recess 20a, the undersurface of container body 1 is imaged by an industrial television camera or the like, the positions of at least three circuit terminals 4a to 4c shown by squares of dashed line in FIG. 1B are discriminated by image recognition, and the IC terminals of IC chip 2 are then positioned in accordance with them. In this case, IC chip 2 is transported by vacuum-sucking the principal surface which is not the circuit formation plane, and is positioned in a predetermined position in recess 20a. In this case, in order to prevent IC chip 2 and circuit terminals 4a to 4f from being positioned in the state in which they are rotated by 180 degrees from the proper mutual positional relation, circuit terminal 4d which differs in shape from circuit terminals 4a to 4c is used. Specifically, at the time of image recognition, circuit terminal 4d is recognized as a different object from circuit terminals 4a to 4c, and is used as the reference for positioning.

Crystal blank 3 is, for example, a substantially rectangular quartz crystal piece of AT-cut. Excitation electrodes 9a are provided respectively on both principal surfaces of crystal blank 3, and lead electrodes 9b are extended from excitation electrodes 9a to both sides of one end portion of crystal blank 3. A pair of crystal holding terminals are provided on the inner bottom surface of other recess 20b of container body 1, and by using conductive adhesive 10 or the like, both sides at one end portion of crystal blank 3 toward which lead electrodes 9b are extended are fixed to the crystal holding terminals. Thereby, crystal blank 3 is electrically and mechanically connected to the crystal holding terminals, and is held in recess 20b. The crystal holding terminals are electrically connected to circuit terminals 4e, 4f which are used as the crystal connection terminals by wiring paths 5 such as via holes (not shown). Accordingly, crystal blank 3 is electrically connected to the oscillating circuit in IC chip 2.

A metal ring (not shown) is provided on a top surface of frame wall layer 1c to surround other recess 20b of container body 1, and metal cover 11 is seam-welded to the metal ring, whereby the opening of recess 20b is closed, and crystal blank 3 is hermetically encapsulated in recess 20b.

When such a crystal oscillator is manufactured, in general, crystal blank 3 is housed in recess 20b and hermetically encapsulated, and thereafter, IC chip 2 is fixed to the inner bottom surface of recess 20a. The tip end of the nozzle is inserted into notch 7 for resin injection provided in container body 1, and protection resin 12 which is used as underfill is injected into a space between the inner bottom surface of recess 20a and IC chip 2, and a space between the outer side surface of IC chip 2 and the inner side surface of recess 20a so as to protect the circuit formation plane of IC chip 2 from ambient atmosphere.

However, in the above described surface-mount crystal oscillator, when the ceramic green sheets configuring bottom plate 1a and frame wall layers 1b, 1c are laminated to form container body 1, a positional deviation within about 50 micrometers may occur, for example. Since circuit terminals 4a to 4d are formed on bottom plate 1a, if such a positional deviation occurs, the positions of circuit terminals 4a to 4d deviate from the original positions in the same direction as a whole with respect to recess 20a which is defined by frame wall layer 1b.

When container body 1 including recess 20a is imaged in the state in which such a deviation exists to perform image recognition, and IC chip 2 is mounted in recess 20a, the space between the inner wall of recess 20a and the outer periphery of IC chip 2 does not become uniform and a portion where the space becomes narrow occurs. As a result, IC chip 2 collides with the inner side surface of recess 20a or frame wall layer 1b, whereby IC chip 2 or frame wall layer 1b break, and IC chip 2 is fixed to the inner bottom surface of recess 20a in an inclined state, which brings about reduction in yield and productivity.

Further, when the space between the inner side surface of recess 20a and the outer peripheral surface of IC chip 2 is narrower than the original space, a nozzle cannot be inserted into notch 7 for resin injection, and injection of protection resin 12 becomes difficult. With respect to the portion narrower than the original space, spread of uncured protection resin 12 becomes unfavorable, as the space is narrower. Therefore, even if the nozzle can be inserted, or the configuration which does not require notch is adopted, proper injection of protection resin 12 becomes difficult after all.

The problem described above becomes more remarkable as the planar outer shape of container body 1 becomes small to be, for example, about 2.0 mm×1.6 mm, and productivity of the crystal oscillator reduces correspondingly.

The above described problem is caused by performing image recognition of the circuit terminals and positioning IC chip 2 with respect to recess 20a when a positional deviation exists between bottom plate 1a having the circuit terminals and frame wall layer 1b which defines recess 20a. Thus, it was conceived to perform image recognition of the three corner portions of the opening end surface of recess 20a, that is, the three corner portions of the surface of frame wall layer 1b surrounding recess 20a instead of performing image recognition of the circuit terminals, and position IC chip 2 to correspond to them. More specifically, in these three corner portions, the corners in the outer periphery of recess 20a, that is, vertices where the shorter sides and longer sides of the inner bottom surface formed to be rectangular of recess 20a, are extracted by image recognition and IC chip 2 is positioned so that the space between the three vertices and the outer periphery of IC chip 2 becomes constant. In this case, the positions of circuit terminals 4a to 4f are likely to deviate with respect to IC chip 2, and therefore, circuit terminals 4a to 4f are formed to be rather large beforehand in view of the deviation.

Wiring paths 5 from circuit terminals 4a to 4d to external terminals 6a to 6d extend to the positions which become the vertices of the inner bottom surface of recess 20a, and the external terminals and wiring paths are plated with gold, and are recognized to be the same color in image recognition. Therefore, there arises the problem that it becomes difficult to discriminate the position of the outer periphery of the inner bottom surface in the vicinity of the vertices of the inner bottom surface of recess 20a by image recognition, and therefore, accurate recognition of the positions of the vertices becomes difficult.

SUMMARY OF THE INVENTION

An object of the present invention is to provide a surface-mount crystal oscillator in which an IC chip is positioned with high accuracy with respect to a recess provided in a container body for housing the IC chip to enhance productivity.

According to one aspect of the present invention, a surface-mount crystal oscillator has: a crystal blank; an IC chip on which an oscillating circuit using the crystal blank is integrated, and which has an IC terminal on at least each of four corner portions; a housing body having a substantially rectangular recess housing the IC chip; a plurality of circuit terminals which are provided on an inner bottom surface of the recess, and to which the IC terminals are fixed via bumps; and external terminals respectively provided at four corner portions of an opening end surface surrounding the recess in the housing body, and electrically connected to the circuit terminals. In the crystal oscillator, in each of at least three vertices out of vertices of the inner bottom surface of the recess, the external terminal corresponding to the vertex is formed on the opening end surface to be in contact with a longer side and a shorter side of an outer perimeter of the recess with the vertex as an inflection point. An exposed part in which the inner bottom surface of the recess is exposed is formed between the circuit terminal which is the closest to the vertex and the external terminal corresponding to the vertex, and a boundary between the opening end surface and the inner bottom surface of the recess can be discriminated by difference of color of the external terminal and color of the exposed part.

According to the above configuration, in each of the positions of at least the three vertices or corners of the inner bottom surface of the recess which is formed in a substantially rectangular shape, the position of the boundary of the surface which is the opening end surface of the recess, that is, the surface which is the surface of the housing body and surrounds the opening of the recess, with the inner bottom surface of the recess can be clearly discriminated by the difference in color between the exposed part and the external terminals at the time of image recognition. Thereby, when the IC chip is housed in the recess based on the result of the image recognition, the IC chip can be positioned so that a space between the outer perimeter of the IC chip and the inner side surface of the recess becomes constant. Thus, breakage or the like of the IC chip can be prevented, and productivity can be enhanced. The housing body is generally made of, for example, laminated ceramics, and gold plating is applied to the external terminals and the circuit terminals. Therefore, by using the present invention, image recognition can be easily performed.

Further, in the present invention, the space between the inner perimeter of the recess of the housing body and the outer perimeter of the IC chip is constant, and therefore, the uncured protection resin can be reliably injected into the space. The protection resin is then cured. In this case, by forming a notch for injecting the protection resin in an inner wall of the recess corresponding to the longer side of the recess, injection of the protection resin can be made more reliable.

In the present invention, a shape of each of three circuit terminals which are the closest to the respective three vertices out of the vertices of the inner bottom surface of the recess preferably differs from a shape of a circuit terminal which is the closest to a remaining one vertex. In doing so, when the IC chip is positioned, such a circuit terminal differing in shape can be utilized as a reference point, and the IC chip can be prevented from being disposed in the recess at the position rotated by 180 degrees from the proper position.

In the present invention, at each vertex of the recess, the circuit terminal which is the closest to the vertex and the external terminal corresponding to the vertex are preferably electrically connected to each other. In the case of such a configuration, the length of the wiring path connecting the circuit terminal and the corresponding external terminal can be made short, and an unnecessary stray capacitance among the wiring patterns can be made small.

DETAILED DESCRIPTION OF THE INVENTION

Figure 1A:
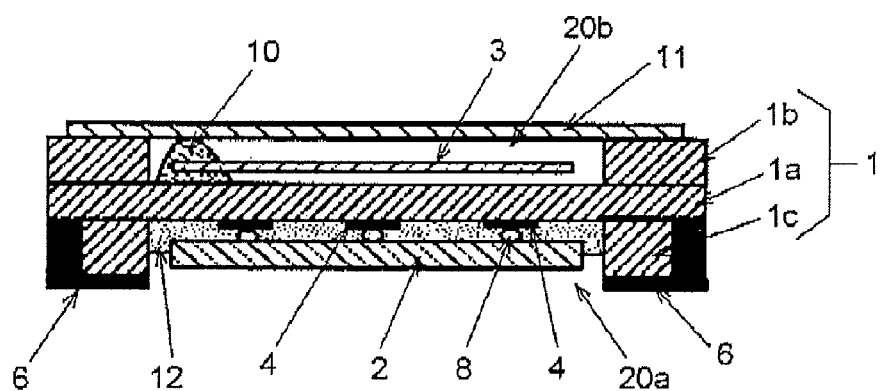
FIG. 1A is a sectional view showing an example of a configuration of a conventional two-chamber type surface-mount crystal oscillator.
Figure 1B:
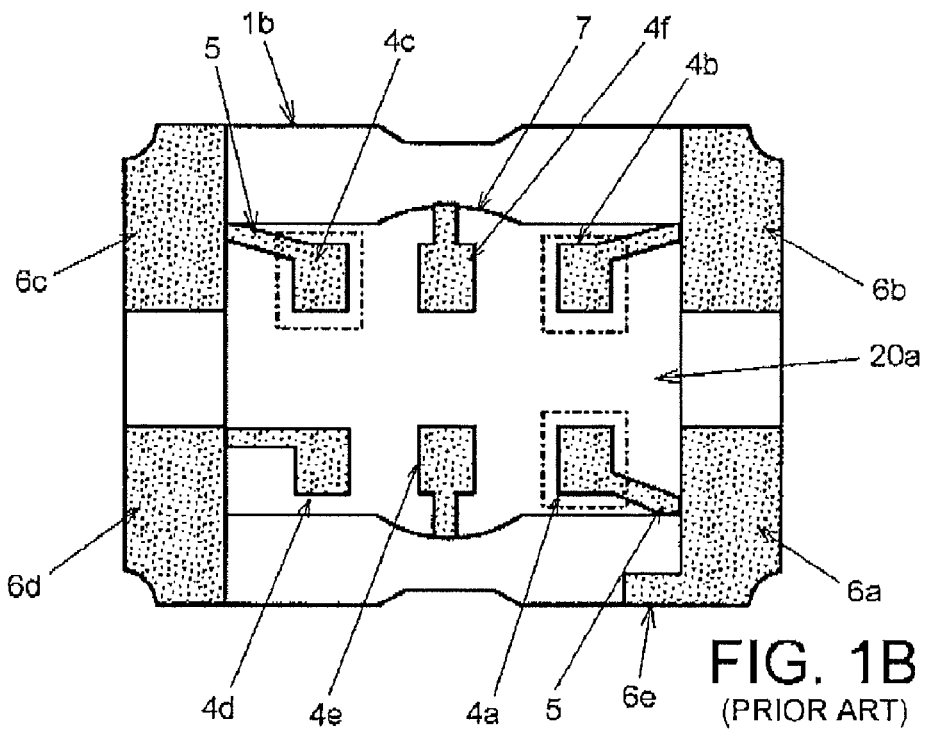
FIG. 1B is a bottom view of a container body in the crystal oscillator shown in FIG. 1A.
Figure 1C:
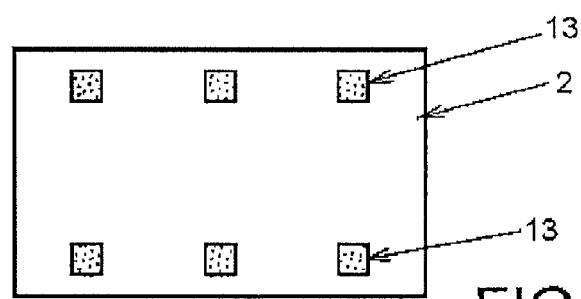
FIG. 1C is a plan view showing a circuit formation plane of an IC chip.
Figure 3:
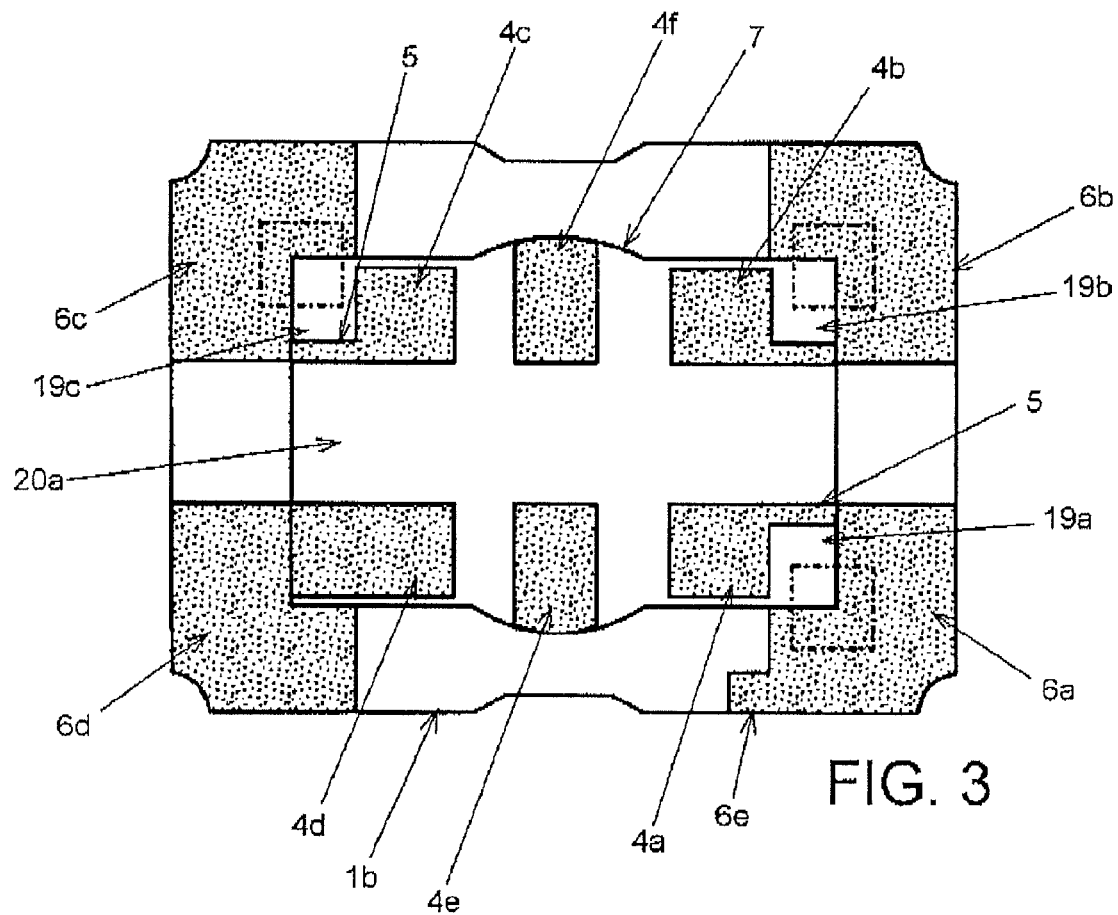
FIG. 3 is a bottom view of a container body in a surface-mount crystal oscillator according to one embodiment of the present invention.

In FIG. 3 showing a surface-mount crystal oscillator according to one embodiment of the present invention, the same components as in FIGS. 1A and 1B are assigned with the same reference numerals, and the redundant description is not repeated.

The surface-mount crystal oscillator of this embodiment is similar to the two-chamber type surface-mount crystal oscillator shown in FIGS. 1A and 1B, but differs from the one shown in FIGS. 1A and 1B in the points of disposition of the circuit terminals in recess 20a for housing IC chip 2 in container body 1 and disposition of the external terminals in the opening end surface of recess 20a. Accordingly, FIG. 3 is a bottom view of container body 1 which is used in the crystal oscillator of this embodiment, and shows recess 20a and a surface of frame wall layer 1b which surrounds recess 20a.

Figure 2:
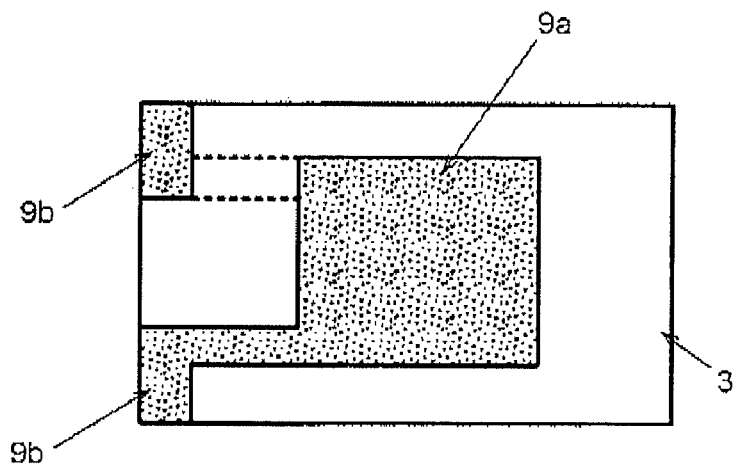
FIG. 2 is a plan view showing a quartz crystal blank.

In the similar manner as shown in FIG. 1A described above, in the crystal oscillator, recesses 20a, 20b are provided on both principal surfaces of flat container body 1 in a substantially rectangular parallelepiped shape, IC chip 2 is fixed to an inner bottom surface of recess 20a and IC chip 2 is housed in recess 20a, and quartz crystal blank 3 is housed in recess 20b. As crystal blank 3, the one shown in FIG. 2 is used. A pair of crystal holding terminals are provided on an inner bottom surface of recess 20b, and both sides of one end portion of crystal blank 3 where lead electrodes 9b are extended are fixed to the crystal holding terminals by using conductive adhesive 10 or the like. Further, by closing recess 20b with metal cover 11, crystal blank 3 is hermetically encapsulated in recess 20b.

Hereinafter, with reference to FIG. 3, external terminals 6a to 6d and circuit terminals 4a to 4f in the crystal oscillator of this embodiment will be described.

The external terminals are formed on the opening end surfaces of recess 20a, that is, the surface which is the outer surface of frame wall layer 1b and surrounds recess 20a. Since recess 20a is formed into a rectangular shape, the inner perimeter of the opening end surface, that is, the outer edge of recess 20a bends in an L-shape at the positions of the vertices of the rectangle. In this embodiment, external terminals 6a to 6d are provided in an L-shape respectively so as to be in contact with the outer perimeter of recess 20a in the four corner portions of container body 1. In other words, each of external terminals 6a to 6d is provided so that the inner perimeter of each of the external terminals is in contact with both the shorter side and longer side of recess 20a at the point of intersection at which the shorter side and longer side of recess 20a intersect each other. Such an external terminal is formed by forming a underlying electrode on a planar ceramic green sheet corresponding to frame wall layer 1b to be rather large as in the above described case, thereafter, providing an opening corresponding to recess 20a in the green sheet, and going through the steps of lamination, firing and plating.

Circuit terminals 4a to 4f which are formed on the inner bottom surface of recess 20a are formed to be larger than the conventional ones shown in FIG. 1B. Circuit terminals 4a to 4d which are provided at the four corner portions of recess 20a are electrically connected to external terminals 6a to 6d through wiring paths 5. Here, circuit terminals 4a to 4c are formed as substantially rectangular regions away from the shorter sides of recess 20a. Wiring paths 5 are extended from circuit terminals 4a to 4c at the positions near the centers of the shorter sides of recess 20a, as elongated regions extending parallel with the longer side of recess 20a. These wiring paths 5 are electrically connected to external terminals 6a to 6c through the lamination plane between bottom plate 1a and frame wall layer 1b and through-hole processed surfaces formed on the side surfaces of frame wall layer 1b at the positions of the corners of the outer periphery of frame wall layer 1b.

As a result, as shown in FIG. 3, substantially rectangular exposed part 19a is formed, in which the ceramic surface of bottom plate 1a is directly exposed by being surrounded by circuit terminal 4a, wiring path 5 and external terminal 6a which are plated with gold, when seen from above recess 20a. Similarly, exposed parts 19b, 19c are formed to correspond to external terminals 4b, 4c. Exposed parts 19a to 19c assume the color of the ceramic layer itself, that is, brown or gray. This can be clearly distinguished from the circuit terminals, wiring paths and external terminals which are plated with gold, at the time of image recognition.

Remaining one circuit terminal 4d out of circuit terminals 4a to 4d at the four corner portions is formed into a shape different from those of circuit terminals 4a to 4c to be used as the reference at the time of discriminating the circuit terminals and positioning the IC chip. In the illustrated example, circuit terminal 4d is provided to extend to the shorter side of the outer perimeter of recess 20a directly without decreasing in width so that an exposed part of ceramics does not substantially occur between circuit terminal 4d and external terminal 6d which are plated with gold, when recess 20a is seen from above. By providing circuit terminal 4d like this, IC chip 2 can be prevented from being fixed to recess 20a in the state rotated by 180 degrees from the proper positional relation.

When IC chip 2 is fixed to recess 20a of such container body 1, the three corner portions on which exposed parts 19a to 19c are formed out of the four corner portions of the inner bottom surface of recess 20a are discriminated by image recognition, IC chip 2 is transported based on the discrimination result, and IC chip 2 is fixed to circuit terminals 4a to 4f by ultrasonic thermocompression bonding using bumps, and electrically connected to the circuit terminals. In FIG. 3, each of the regions to be the objects of image recognition is shown by a rectangle of a dashed line.

As in the above described case, notches 7 are formed in the central regions of both the longer sides of recess 20a. After IC chip 2 is fixed to recess 20a, protection resin 12 as underfill is injected with a nozzle at the position of notch 7 to protect the circuit formation plane of IC chip 2.

By such a configuration, exposed parts 19a to 19c, which are rectangular regions surrounded by the external terminals, wiring paths and circuit terminals that are all gold, and assume the color of ceramics just as it is, are present, and therefore, the positions of the three vertices where exposed parts 19a to 19c are formed, out of the four corner portions of the inner bottom surface of recess 20a, can be reliably discriminated by image recognition. Accordingly, when IC chip 2 is fixed to recess 20a, the space between the outer perimeter of IC chip 2 and the inner side surface of the recess can be made constant, and IC chip 2 can be disposed on the inner bottom surface of recess 20a with high accuracy. IC chip 2 does not collide with frame wall layer 1b at the time of the fixing operation of IC chip 2, and breakage of IC chip 2 and frame wall layer 1b can be prevented. Further, the dimensions of notches 7 for resin injection including the spaces can be secured, so that protection resin 12 can be reliably injected. In this example, circuit terminals 4a to 4f are provided in advance to be larger than the conventional one shown in FIG. 1B. Therefore, even if a little deviation occurs at the time of lamination of the ceramic green sheets, the IC chip can be reliably joined to circuit terminals 4a to 4f through bumps B.

Thus, in the crystal oscillator of this embodiment, yield at the time of manufacture of the crystal oscillator can be enhanced, and productivity can be enhanced.

The example of applying the present invention to the two-chamber type surface-mount crystal oscillator is described above, but the crystal oscillator to which the present invention is applied is not limited to the two-chamber type. For example, the present invention can be also applied to a bonding-type surface-mount crystal oscillator in which a mounting substrate with a recess formed in one of the principal surfaces and an IC chip housed in the recess is used, and the mounting substrate is joined to the outer bottom surface of a crystal unit in which a quartz crystal blank is hermetically encapsulated. In this case, as in the case of the container body in the above described crystal oscillator, circuit terminals and wiring paths are formed on the inner bottom surface of a recess of the mounting substrate, and external terminals are formed on the opening end surface of the recess. In the bonding type crystal oscillators, as the mode of joining the mounting substrate and the crystal unit, there are cited a first mode in which the recess of the mounting substrate is oriented to the outer bottom surface of the crystal unit, and a second mode in which the principal plane on which the recess in the mounting substrate is not provided is joined to the outer bottom surface of the crystal unit.

Figure 4:
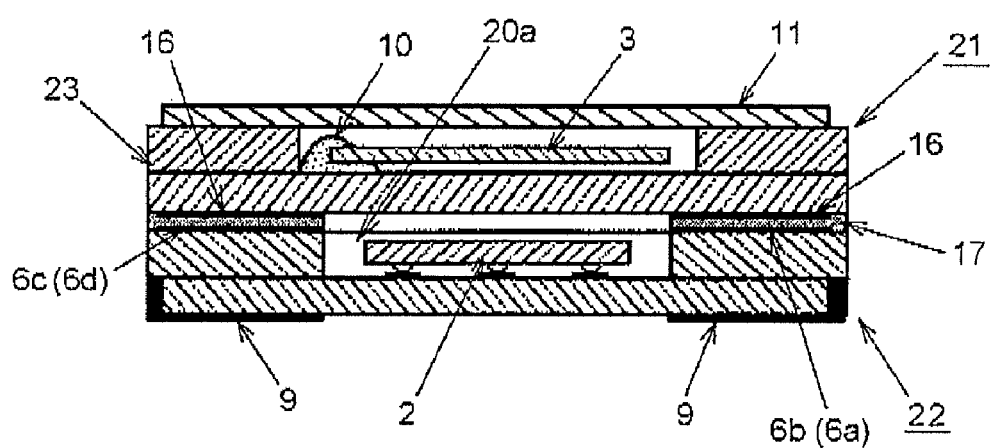
FIG. 4 is a sectional view showing a surface-mount crystal oscillator according to another embodiment of the present invention.

FIG. 4 shows the bonding-type surface-mount crystal oscillator according to the first mode. Crystal unit 21 is formed by hermetically encapsulating crystal blank 3 in a recess formed in container 23, and the recess of container 23 is closed with metal cover 11. As crystal blank 3, the one shown in FIG. 2 is used, and crystal blank 3 is fixed to the inner bottom surface of the recess of container 23 by conductive adhesive 10. Joint terminals 16 for use in electrical and mechanical connection with mounting substrate 22 are formed on the four corner portions of the outer bottom surface of container 23. Two of joint terminals 16 are electrically connected to crystal blank 3, and remaining two joint terminals 16 are used as ground terminals.

Mounting substrate 22 is made of laminated ceramics, and is equivalent to container body 1 shown In FIG. 1A from which frame wall layer 1c is removed. Accordingly, recess 20a which houses IC chip 2 is formed on one of principal surfaces of mounting substrate 22, circuit terminals and wiring paths are formed on the inner bottom surface of recess 20a as described above, and external terminals 6a to 6d are formed on the opening end surface of recess 20a. Here, external terminals 6a to 6d are not used as the mounting terminals for surface-mounting the crystal oscillator on the wiring board, but are used for electrical connection with crystal unit 21. By joining external terminals 6a to 6d to joint terminals 16 of crystal unit 21 by solder 17, mounting substrate 22 is joined to the bottom surface of crystal unit 21.

Mounting terminals 9 which are used when the crystal oscillator is surface-mounted on a wiring board are provided at four corner portions of the other principal surface of mounting substrate 22. External terminals 6a to 6d and mounting terminals 9 are electrically connected to the circuit terminals of recess 20a through the wiring paths provided in mounting substrate 22. IC chip 2 is joined to the circuit terminals by ultrasonic thermocompression bonding using bumps.

Since in this crystal oscillator, the circuit terminals, wiring paths and external terminals are formed in mounting substrate 22 as in the case of the above described embodiment, IC chip 2 can be positioned in recess 20a of mounting substrate 22 with high accuracy, and productivity of the crystal oscillator can be enhanced.

In the second mode of the bonding-type surface-mount crystal oscillator, as compared with the one shown in FIG. 4, recess 20a faces a wiring board, and therefore, the external terminals formed on the opening end surface of recess 20a are used as mounting terminals, whereas the terminals provided at four corner portions of the other principal surface of mounting substrate 22 are used for electrical and mechanical connection with crystal unit 21.

What is claimed is:

1. A surface-mount crystal oscillator, comprising:
    a crystal blank;
    an IC chip on which an oscillating circuit using said crystal blank is integrated, and which has an IC terminal on at least each of four corner portions, said IC chip being in a substantially rectangular shape;
    a housing body having a substantially rectangular recess housing said IC chip;
    a plurality of circuit terminals which are provided on an inner bottom surface of said recess, and to which said IC terminals are fixed via bumps; and
    external terminals respectively provided at four corner portions of an opening end surface surrounding said recess in said housing body, and electrically connected to said circuit terminals,
    wherein in each of at least three vertices out of vertices of the inner bottom surface of said recess, said external terminal corresponding to the vertex is formed on said opening end surface to be in contact with a longer side and a shorter side of an outer perimeter of said recess with said vertex as an inflection point, an exposed part in which the inner bottom surface of said recess is exposed is formed between the circuit terminal which is the closest to the vertex and the external terminal corresponding to said vertex such that the inner bottom surface is exposed at least at said vertex, and a boundary between said opening end surface and the inner bottom surface of said recess can be discriminated by difference of color of said external terminal and color of said exposed part thereby enabling discrimination of a position of said vertex by image recognition.

2. The crystal oscillator according to claim 1, wherein said housing body is made of ceramics, and gold plating is applied to said external terminals and said circuit terminals.

3. The crystal oscillator according to claim 1, wherein a protection resin is injected between an inner perimeter of said recess and an outer perimeter of said IC chip.

4. The crystal oscillator according to claim 3, wherein a notch for injecting said protection resin is formed in an inner wall of said recess corresponding to the longer side of said recess.

5. The crystal oscillator according to claim 1, wherein a shape of each of three circuit terminals which are the closest to the respective three vertices out of the vertices of the inner bottom surface of said recess differs from a shape of a circuit terminal which is the closest to a remaining one vertex.

6. The crystal oscillator according to claim 1, wherein at each vertex of said recess, the circuit terminal which is the closest to the vertex and the external terminal corresponding to the vertex are electrically connected to each other.

7. The crystal oscillator according to claim 1, wherein said IC chip includes six IC terminals, and IC terminals provided in substantially central regions of a pair of opposed sides of said IC chip are used for electrical connection with said crystal blank.

8. The crystal oscillator according to claim 1, wherein said housing body is a container body having recesses on both principal surfaces respectively, the recess of said housing body is one of the recesses of said container body, and said crystal blank is housed and hermetically encapsulated in the other recess of said container body.

9. The crystal oscillator according to claim 1, wherein said housing body is a mounting substrate having said recess on one principal surface, and said mounting substrate is joined to an outer bottom surface of a crystal unit in which said crystal blank is hermetically encapsulated.

10. The crystal oscillator according to claim 1, wherein said exposed part is in a substantially rectangular shape.

* * * * *